(12) United States Patent
Lee et al.

(10) Patent No.: US 9,885,955 B2
(45) Date of Patent: Feb. 6, 2018

(54) THINNER COMPOSITIONS

(71) Applicants: Samsung Electronics Co., Ltd., Suwon-si (KR); DONGWOO FINE-CHEM, Pyeongtaek-si, Gyeonggi-do (KR)

(72) Inventors: Ahn-Ho Lee, Yongin-si (KR); Seung-Hyun Ahn, Suwon-si (KR); Jin-Seok Yang, Gwangju (KR); Sang-Tae Kim, Iksan-si (KR); Shi-Jin Sung, Seoul (KR); Kyong-Ho Lee, Osan-si (KR)

(73) Assignees: Samsung Electronics Co., Ltd., Suwon-si (KR); Dongwoo Fine-Chem, Pyeongtaek-si (KR)

( * ) Notice: Subject to any disclaimer, the term of this patent is extended or adjusted under 35 U.S.C. 154(b) by 0 days.

(21) Appl. No.: 14/992,061

(22) Filed: Jan. 11, 2016

(65) Prior Publication Data

US 2016/0202610 A1  Jul. 14, 2016

(30) Foreign Application Priority Data

Jan. 12, 2015 (KR) ........................ 10-2015-0004210

(51) Int. Cl.
*G03F 7/16* (2006.01)
*H01L 21/31* (2006.01)
*H01L 21/76* (2006.01)
*H01L 21/02* (2006.01)
*H01L 21/311* (2006.01)
*H01L 21/768* (2006.01)
*H01L 21/027* (2006.01)

(52) U.S. Cl.
CPC .......... *G03F 7/168* (2013.01); *H01L 21/0276* (2013.01); *H01L 21/02087* (2013.01); *H01L 21/31133* (2013.01); *H01L 21/31144* (2013.01); *H01L 21/76802* (2013.01)

(58) Field of Classification Search
CPC ............... G03F 7/168; H01L 21/31144; H01L 21/76802; H01L 21/02087; H01L 21/0276; H01L 21/31133

USPC .......................................... 438/674
See application file for complete search history.

(56) References Cited

U.S. PATENT DOCUMENTS

| 4,113,492 | A | 9/1978 | Sato et al. | |
|---|---|---|---|---|
| 5,866,305 | A | 2/1999 | Chon et al. | |
| 6,136,502 | A * | 10/2000 | Satoshi | G03F 7/039 430/170 |
| 6,589,719 | B1 | 7/2003 | Ahn et al. | |
| 7,387,988 | B2 * | 6/2008 | Ahn | C11D 11/0047 134/1.3 |
| 7,863,231 | B2 | 1/2011 | Ahn et al. | |
| 7,888,301 | B2 | 2/2011 | Bernhard et al. | |
| 8,338,087 | B2 | 12/2012 | Rath et al. | |
| 2005/0277059 | A1 * | 12/2005 | Kanda | G03F 7/11 430/273.1 |
| 2006/0008748 | A1 * | 1/2006 | Inabe | G03F 7/11 430/326 |
| 2006/0131267 | A1 * | 6/2006 | Lee | C03C 17/28 216/41 |
| 2006/0267592 | A1 | 11/2006 | Choi | |

FOREIGN PATENT DOCUMENTS

| KR | 10-2005-0037855 | 4/2005 |
|---|---|---|
| KR | 10-2006-0104688 | 10/2006 |
| KR | 10-2011-0038341 | 4/2011 |
| KR | 10-2013-0016882 | 2/2013 |
| KR | 10-2013-0047331 | 5/2013 |

* cited by examiner

Primary Examiner — Michael M Bernshteyn
(74) Attorney, Agent, or Firm — Myers Bigel, P.A.

(57) ABSTRACT

A thinner composition including an acetate-based compound in an amount in a range of about 30 weight percent to about 70 weight percent, a lactate-based compound in an amount in a range of about 1 weight percent to about 20 weight percent, a propionate-based compound in an amount in a range of about 30 weight percent to about 60 weight percent, and an ether-based additive in an amount in a range of about 10 ppm to about 500 ppm, based on a total amount of the composition.

3 Claims, 10 Drawing Sheets

THINNER COMPOSITIONS

CROSS-REFERENCE TO RELATED APPLICATION

This application claims the benefit of and priority under 35 USC § 119 to Korean Patent Application No. 10-2015-0004210, filed on Jan. 12, 2015, the contents of which are incorporated by reference herein in their entirety.

FIELD

Example embodiments relate to thinner compositions and methods of manufacturing semiconductor devices using the same. More particularly, example embodiments relate to thinner compositions utilized in a photo process and methods of manufacturing semiconductor devices using the same.

BACKGROUND

A photolithography process may be utilized for a formation of various patterns, e.g., an insulation layer pattern or a circuit pattern included in a semiconductor device. For example, an anti-reflective layer and a photoresist layer may be formed on a semiconductor wafer, and then exposure and developing processes may be performed to form a photoresist pattern from the photoresist layer.

In the photolithography process, a thinner composition may be applied to remove irregular portions of the anti-reflective layer and/or the photoresist layer on the semiconductor wafer.

SUMMARY

Example embodiments of the present inventive concepts provide a thinner composition having improved chemical properties.

Example embodiments of the present inventive concepts provide a method of manufacturing a semiconductor device using a thinner composition of the present inventive concepts.

Example embodiments of the present inventive concepts provide a method of forming a photoresist pattern using a thinner composition of the present inventive concepts.

In some embodiments, a thinner composition is provided. The thinner composition includes an acetate-based compound in an amount in a range of about 30 weight percent to about 70 weight percent, a lactate-based compound in an amount in a range of about 1 weight percent to about 20 weight percent, a propionate-based compound in an amount in a range of about 30 weight percent to about 60 weight percent, and an ether-based additive in an amount in a range of about 10 parts per million (ppm) to about 500 ppm, based on a total amount of the composition.

In some embodiments, the thinner composition may include the acetate-based compound in an amount in a range of about 40 weight percent to about 60 weight percent, the lactate-based compound in an amount in a range of about 10 weight percent to about 20 weight percent, the propionate-based compound in an amount in a range of about 30 weight percent to about 40 weight percent, and the ether-based additive in an amount in a range of about 10 ppm to about 300 ppm, based on the total amount of the composition.

In some embodiments, the acetate-based compound may include propylene glycol alkyl ether acetate, the lactate-based compound may include an alkyl lactate, and the propionate-based compound may include methyl 2-hydroxy-2-methyl propionate (HBM).

In some embodiments, the ether-based additive may include a hydrocarbon-based glycol ether.

In some embodiments, the hydrocarbon-based glycol ether may have a viscosity in a range of about 1 centipoise (cp) to about 10 cp at room temperature, and a molecular weight in a range of about 100 to about 200.

In some embodiments, the hydrocarbon-based glycol ether may have a structure represented by:

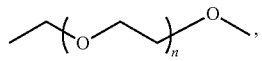

wherein n may be 1, 2 or 3.

In some embodiments, the ether-based additive may include at least one of diethylene glycol methyl ethyl ether, ethylene glycol methyl ether, diethylene glycol methyl ether, diethylene glycol ethyl ether, diethylene glycol butyl ether, diethylene glycol dimethyl ether and diethylene glycol diethyl ether.

According to some embodiments, a method of manufacturing a semiconductor device is provided. In the method, a photoresist composition is coated on a semiconductor substrate. A portion of the photoresist composition at an edge portion of the semiconductor substrate is removed using a thinner composition. The thinner composition comprises an acetate-based compound in an amount in a range of about 30 weight percent to about 70 weight percent, a lactate-based compound in an amount in a range of about 1 weight percent to about 20 weight percent, a propionate-based compound in an amount in a range of about 30 weight percent to about 60 weight percent, and an ether-based additive in an amount in a range of about 10 ppm to about 500 ppm, based on a total amount of the thinner composition. The photoresist composition is cured to form a photoresist layer. The photoresist layer is exposed to light.

In some embodiments, before coating the photoresist composition, the semiconductor substrate may be pre-wetted by injecting the thinner composition thereon.

In some embodiments, a BARC (Bottom of Anti-Reflection Coating) composition may be coated on the semiconductor substrate before coating the photoresist composition. A portion of the BARC composition at the edge portion of the semiconductor substrate may be removed using the thinner composition.

In some embodiments, the portion of the photoresist composition at the edge portion of the semiconductor substrate may include a protrusion covering upper and lower surfaces of the semiconductor substrate. In removing the portion of the photoresist composition using the thinner composition, the thinner composition may be injected individually toward upper and lower portions of the protrusion.

In some embodiments, the ether-based additive may include a hydrocarbon-based glycol ether having a viscosity in a range of about 1 cp to about 10 cp at room temperature, and a molecular weight in a range of about 100 to about 200.

In some embodiments, a first object layer may be formed on the semiconductor substrate before coating the photoresist composition. An exposed portion or a non-exposed portion of the photoresist layer may be selectively removed to form a photoresist pattern. The first object layer may be partially etched using the photoresist pattern to form a first opening in the first object layer.

In some embodiments, a first conductive pattern may be formed in the first opening. A second object layer may be formed on the first object layer and the first conductive pattern. The photoresist composition may be coated on the second object layer. A portion of the photoresist composition at an edge portion of the second object layer may be removed using the thinner composition. The photoresist composition remaining on the second object layer may be cured to form an upper photoresist layer.

In some embodiments, the upper photoresist layer may be partially removed to form an upper photoresist pattern. The second object layer may be partially etched using the upper photoresist pattern to form a second opening through which the first conductive pattern may be exposed. A second conductive pattern may be formed in the second opening.

In some embodiments, a BARC composition may be coated on the second object layer before coating the photoresist composition on the second object layer. A portion of the BARC composition at the edge portion of the second object layer may be removed using the thinner composition.

In some embodiments, a surface of the first object layer may be pre-wetted using the thinner composition.

According to some embodiments, there is provided a method of forming a photoresist pattern. In the method, a surface of a substrate is pre-wetted using a thinner composition. The thinner composition comprises an acetate-based compound in an amount in a range of about 30 weight percent to about 70 weight percent, a lactate-based compound in an amount in a range of about 1 weight percent to about 20 weight percent, a propionate-based compound in an amount in a range of about 30 weight percent to about 60 weight percent, and an ether-based additive in an amount in a range of about 10 ppm to about 500 ppm, based on a total amount of the thinner composition. A photoresist composition is coated on the pre-wetted surface of the substrate. A portion of the photoresist layer at an edge portion of the substrate is removed using the thinner composition. The photoresist composition is cured to form a photoresist layer. The photoresist layer is exposed to light.

In some embodiments, the thinner composition may include the acetate-based compound in an amount in a range of about 40 weight percent to about 60 weight percent, the lactate-based compound in an amount in a range of about 10 weight percent to about 20 weight percent, the propionate-based compound in an amount in a range of about 30 weight percent to about 40 weight percent, and the ether-based additive in an amount in a range of about 10 ppm to about 300 ppm, based on the total amount of the composition.

In some embodiments, a BARC composition may be coated on the pre-wetted surface of the substrate before coating the photoresist composition. A portion of the BARC composition at the edge portion of the substrate may be removed using the thinner composition.

According to some embodiments, provided is a composition including a first compound including an acetyl moiety; a second compound including a lactate moiety; a third compound including a propionate moiety; and at least one ether, wherein the composition does not comprise fluorine or silicon.

In some embodiments, the first compound is present in the composition in an amount in a range of about 30% to about 70% by weight of the composition; the second compound is present in the composition in an amount in a range of about 1% to about 20% by weight of the composition; the third compound is present in the composition in an amount in a range of about 30% to about 60% by weight of the composition; and the at least one ether is present in the composition in an amount in a range of about 10 ppm to about 500 ppm.

In some embodiments, the ether is a glycol ether, optionally selected from diethylene glycol methyl ethyl ether, ethylene glycol methyl ether, diethylene glycol methyl ether, diethylene glycol ethyl ether, diethylene glycol butyl ether, diethylene glycol dimethyl ether and diethylene glycol diethyl ether. In some embodiments, the glycol ether has a viscosity in a range of about 1 centipoise (cp) to about 10 cp at room temperature, and a molecular weight in a range of about 100 to about 200.

In some embodiments, the ether is represented by the following chemical structure:

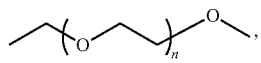

wherein n is 1, 2 or 3.

BRIEF DESCRIPTION OF THE DRAWINGS

The above and other aspects, features and advantages of the present inventive concepts will become more apparent in view of the attached drawings and accompanying detailed description. The drawings provided herein represent non-limiting, example embodiments according to various embodiments of the present inventive concepts.

DESCRIPTION OF EMBODIMENTS

Figure 1:
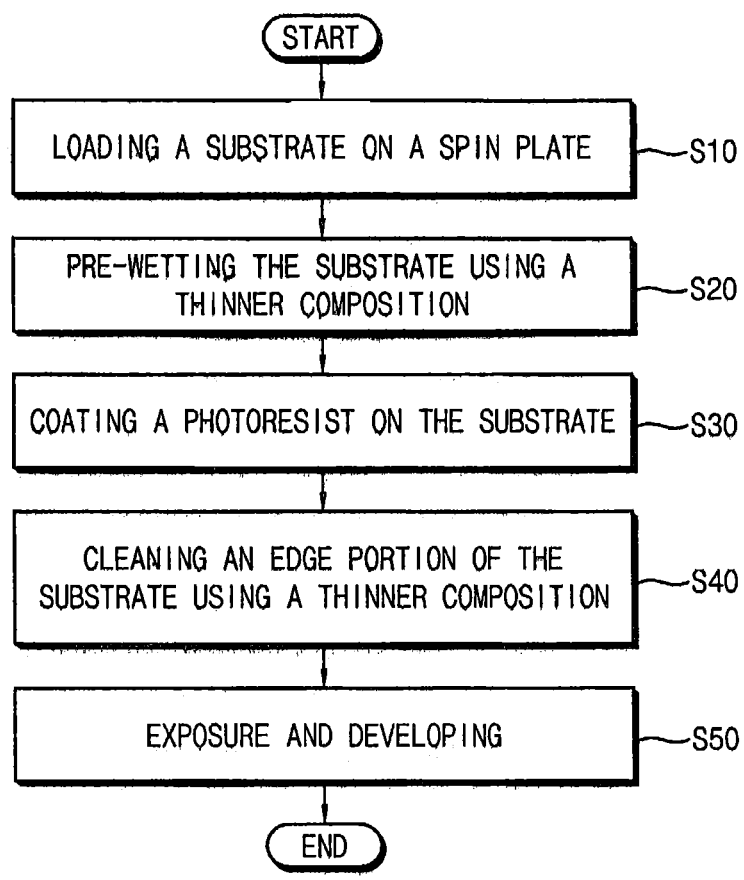
FIG. 1 is a flow diagram illustrating a method of forming a photoresist pattern in accordance with example embodiments of the present inventive concepts.

Various example embodiments are described below with reference to the accompanying drawings, in which some example embodiments are shown. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the disclosure.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of disclosure to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. For example, an implanted region illustrated as a rectangle may actually have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which these present inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A thinner composition in accordance with example embodiments of the present inventive concepts may include an acetate-based compound, a lactate-based compound, a propionate-based compound, and an ether-based additive.

In some embodiments, the thinner composition may have a solubility with respect to a photoresist material for a light source including, e.g., I-line, KrF or ArF.

In some embodiments, the thinner composition may be used for removing a photoresist material irregularly remaining on an edge portion of a substrate (e.g., an edge bead). For example, the thinner composition may be used in an edge bead removal (EBR) process.

In some embodiments, the thinner composition may be used for pre-wetting a surface of the substrate such as a silicon wafer before coating a photoresist. Accordingly, a surface tension of the substrate may be decreased so that an amount of the photoresist for a formation of a photoresist layer or a BARC (Bottom of Anti-Reflection Coating) layer may be reduced. Therefore, an RRC (Reducing Resist Coating) property of a photolithography process may be improved.

In some embodiments, propylene glycol alkyl ether acetate may be used as the acetate-based compound. For example, propylene glycol monomethyl ether acetate (PGMEA) may be used as the acetate-based compound.

In some embodiments, the thinner composition may include an acetate-based compound (e.g., PGMEA) in an amount in a range of about 30 weight percent (wt %) to about 70 wt % based on a total weight of the composition.

If the amount of the acetate-based compound is less than about 30 wt %, a coatability of the thinner composition may be degraded, and thus a sufficient RRC property may not be achieved by the above-mentioned pre-wetting process. If the amount of the acetate-based compound exceeds about 70 wt %, then a solubility of the thinner composition with respect to, e.g., the photoresist layer or the BARC layer for ArF, may be reduced.

In some embodiments, the thinner composition may include the acetate-based compound in an amount in a range of about 40 wt % to about 60 wt % based on the total weight of the composition.

The lactate-based compound may include a non acetate-based ester compound. For example, an alkyl lactate such as ethyl lactate (EL) may be used as the lactate-based compound.

In example embodiments, the thinner composition may include the lactate-based compound (e.g., EL) in an amount in a range of about 1 wt % to about 20 wt % based on the total weight of the composition.

If the amount of the lactate-based compound is less than about 1 wt %, the coatability of the thinner composition may be degraded, and thus a sufficient RRC property may not be achieved by the above-mentioned pre-wetting process. If the amount of the lactate-based compound exceeds about 20 wt %, then a volatility of the thinner composition may be reduced and this may cause particles on the substrate or the wafer or a photoresist tailing (PR-tail) during the above-mentioned EBR process or the pre-wetting process.

In some embodiments, the thinner composition may include the lactate-based compound in an amount in a range of about 10 wt % to about 20 wt % based on the total weight of the composition.

The propionate-based compound may include, e.g., methyl 2-hydroxy-2-methyl propionate (HBM).

In some embodiments, the thinner composition may include the propionate-based compound (e.g., HBM) in an amount in a range of about 30 wt % to about 60 wt % based on the total weight of the composition.

If the amount of the propionate-based composition is less than about 30 wt %, then a solubility of a resin material included in a photoresist, e.g., I-line, KrF or ArF, with respect to the thinner composition may be decreased. Thus, a sufficient EBR property may not be achieved. If the amount of the propionate-based compound exceeds about 60 wt %, then a viscosity of the thinner composition may be excessively increased and may cause a deterioration of a pre-wetting property.

In some embodiments, the thinner composition may include the propionate-based compound in an amount in a range of about 30 wt % to about 40 wt % based on the total weight of the composition.

The ether-based additive may serve as a surfactant in the thinner composition to improve a solubility with respect to the photoresist and the BARC. An ether-based compound having a viscosity and a molecular weight in a suitable range may be chosen for the thinner composition.

If the viscosity of the ether-based additive is excessively low, then sufficient pre-wetting and EBR properties of the thinner composition may not be realized. If the viscosity of the ether-based additive is excessively increased, then the volatility of the thinner composition may be reduced, which may cause particles on the substrate or the wafer.

In some embodiments, a compound having a viscosity in a range of about 1 cp to about 100 cp at room temperature, or, in some embodiments, in a range of about 1 cp to about 10 cp may be chosen as the ether-based compound.

If the molecular weight of the ether-based additive is excessively low, then the volatility of the thinner composition may be excessively increased, or a sufficient solubility may not be achieved. If the molecular weight of the ether-based additive is excessively increased, then an aggregation between molecules may be caused due to a large dispersion force. Thus, when the thinner composition is injected for the pre-wetting process or the EBR process, a straight injection of the thinner composition may not be easily implemented and may result in a poor coating property.

In some embodiments, a hydrocarbon-based glycol ether may be used as the ether-based additive. For example, the ether-based additive may include dialkylene glycol alkyl ether, dialkylene glycol dialkyl ether, alkylene glycol dialkyl ether or alkylene glycol alkyl ether such as diethylene glycol methyl ethyl ether, ethylene glycol methyl ether, diethylene glycol methyl ether, diethylene glycol ethyl ether, diethylene glycol butyl ether, diethylene glycol dimethyl ether and diethylene glycol diethyl ether. These may be used alone or in any combination thereof.

In some embodiments, the ether-based additive may have a structure represented by:

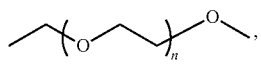

wherein n is, e.g., 1, 2 or 3. In this case, the molecular weight of the ether-based additive may be in a range of about 100 to about 200.

Fluorine (F) and silicon (Si) atoms and/or ingredients may be excluded from the hydrocarbon-based glycol ether. Accordingly, aggregation between molecules of the ether-based additive caused by fluorine or silicon may be avoided. Additionally, the generation of particles caused by an interaction with the substrate and/or the photoresist may be prevented. Toxicity and pollution from fluorine may be also avoided.

In some embodiments, the ether-based compound may be included in the thinner composition in an amount in a range of about 10 ppm to about 500 ppm based on the total weight of the composition. If the amount of the ether-based additive is less than about 10 ppm, then sufficient pre-wetting and EBR properties may not be achieved. If the amount of the ether-based additive exceeds about 500 ppm, then aggregation and/or the generation of particles may occur.

In some embodiments, the ether-based compound may be included in a range of about 10 ppm to about 300 ppm based on the total weight of the composition.

According to example embodiments as described above, the thinner composition may include an ether-based additive having a viscosity and a molecular weight within a predetermined range. Thus, pattern failure caused by aggregation and particles of the thinner composition may be suppressed so that coating and/or pre-wetting properties with respect to a substrate or a wafer may be improved. Further, solubility with respect to a photoresist layer or a BARC layer may be increased so that EBR and RRC properties may be improved.

FIG. 1 is a flow diagram illustrating a method of forming a photoresist pattern in accordance with example embodiments of the present inventive concepts. FIGS. 2 to 9 are cross-sectional views illustrating a method of forming a photoresist pattern in accordance with example embodiments of the present inventive concepts.

Figure 2:
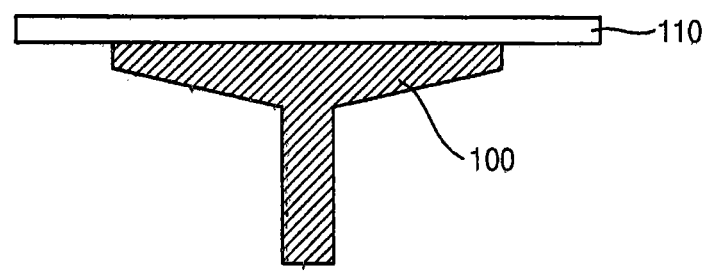
FIGS. 2 to 9 are cross-sectional views illustrating a method of forming a photoresist pattern in accordance with example embodiments of the present inventive concepts.

Referring to FIGS. 1 and 2, in an operation S10, a substrate 110 may be loaded on a spin plate 100.

In some embodiments, the spin plate 100 may be placed in a spin coating process chamber, and may be coupled to a rotating chuck.

The substrate 110 may be a semiconductor wafer including silicon or germanium. In some embodiments, an object layer, such as an oxide layer, may be formed on the substrate 110.

Figure 3:
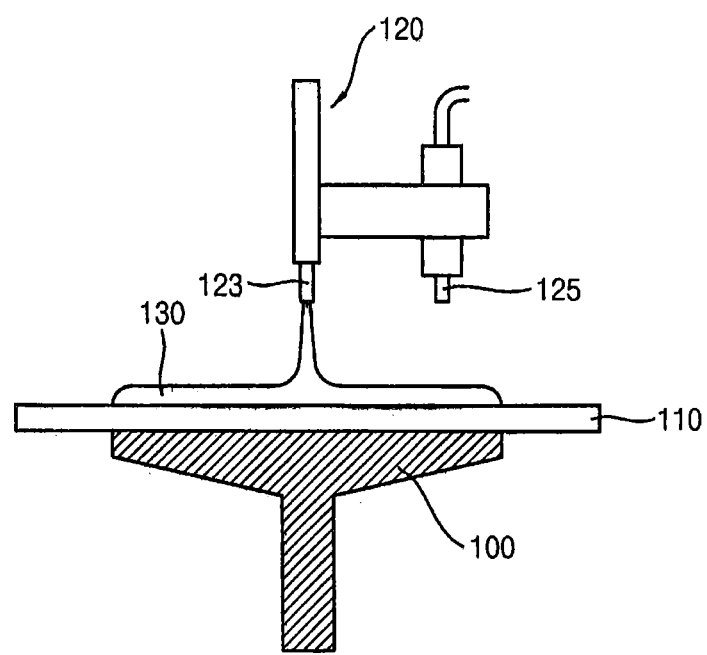

Referring to FIGS. 1 and 3, in an operation S20, the substrate 110 may be pre-wetted by a thinner composition 130.

For example, an injection apparatus 120 including a first injector 123 and a second injector 125 may be placed over the substrate 110. The thinner composition 130 and a photoresist composition 140 (see FIG. 4) may be injected through the first injector 123 and the second injector 125, respectively.

While rotating the spin plate 100, the thinner composition 130 may be injected onto the substrate 110, e.g., a top surface of the substrate 110, through the first injector 123. The thinner composition 130 may contact the top surface of the substrate 110, and then may be volatilized and removed. Accordingly, the top surface of the substrate 110 may be surface-treated to have a reduced surface tension.

In some embodiments, as described above, the thinner composition 130 may include an acetate-based compound, a lactate-based compound, a propionate-based compound, and an ether-based additive.

In some embodiments, PGMEA may be used as the acetate-based compound, an alkyl lactate (e.g., EL) may be used as the lactate-based compound, and HBM may be used as the propionate-based compound. A hydrocarbon-based glycol ether may be used as the ether-based additive. The hydrocarbon-based glycol ether may include dialkylene glycol alkyl ether, dialkylene glycol dialkyl ether, alkylene glycol dialkyl ether and/or alkylene glycol alkyl ether. These may be used alone or in any combination thereof.

In some embodiments, the thinner composition 130 may include PGMEA in an amount in a range of about 30 wt % to about 70 wt %, the alkyl lactate in an amount in a range of about 1 wt % to about 20 wt %, HBM in an amount in a range of about 30 wt % to about 60 wt %, and the ether-based additive in an amount in a range of about 10 ppm to about 500 pp, based on a total amount of the composition.

In some embodiments, the thinner composition 130 may include PGMEA in an amount in a range of about 40 wt % to about 60 wt %, the alkyl lactate in an amount in a range of about 10 wt % to about 20 wt %, HBM in an amount in a range of about 30 wt % to about 40 wt %, and the ether-based additive in an amount in a range of about 10 ppm to about 300 ppm, based on a total amount of the composition.

The ether-based additive may serve as a surfactant, and may have a viscosity and a molecular weight in the above-mentioned ranges. Accordingly, the thinner composition 130 may have optimized coatability and volatility. After being injected onto a top surface of the substrate 110, the thinner composition 130 may be vaporized so that remaining particles from the composition may be prevented from aggregating.

Figure 4:
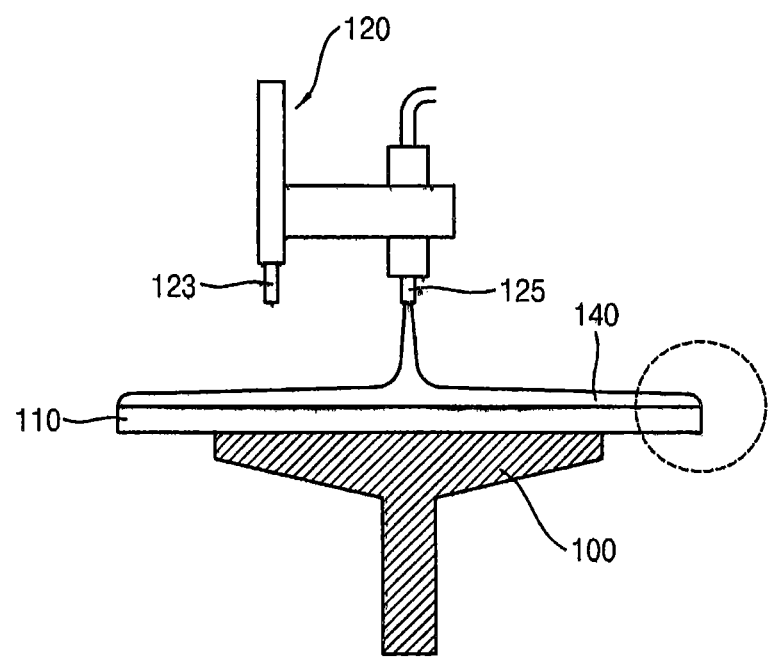

Referring to FIGS. 1 and 4, in an operation S30, a photoresist composition 140 may be coated on the substrate 110.

The photoresist composition 140 may be injected through the second injector 125 onto the top surface of the substrate 110 pre-wetted by the thinner composition 130 while rotating the spin plate 100. Thus, in some embodiments, an amount of the photoresist composition 140 required to form a photoresist layer 160 (see FIG. 6) of a predetermined thickness may be reduced.

In some embodiments, a BARC composition may be coated before coating the photoresist composition 140.

The photoresist composition 140 may be prepared by dissolving a photoresist material in an organic solvent. The photoresist composition 140 may further include a photo-acid generator (PAG) and a sensitizer.

The photoresist material may include a positive-type polymer in which a cross-linked bond may be decomposed, or a leaving group combined to a back-bone chain that may be separated at an exposed portion.

The backbone chain may include a polymer chain such as novolak, polystyrene, polyhydroxystyrene (PHS), polyacrylate, polymethacrylate, polyvinyl ester, polyvinyl ether, polyolefin, polynorbornene, polyester, polyamide, polycarbonate or the like.

The leaving group may include an acetal group, an ether group, a thioether group, or the like. The ether leaving group may include, e.g., t-butyloxycarbonyl (t-Boc).

The photoresist material may include a negative-type polymer in which a cross-linking reaction or a curing reaction may occur at an exposed portion.

Hereinafter, descriptions are provided using an embodiment in which the photoresist material includes a positive-type polymer.

The PAG may include any compound capable of generating an acid by an exposure process. For example, the PAG may include an onium salt, an aromatic diazonium salt, a sulfonium salt, a triarylsulfonium salt, a diarylsulfonium salt, a monoarylsulfonium salt, an iodonium salt, a diaryliodonium salt, nitrobenzyl ester, disulfone, diazo-disulfone, sulfonate, trichloromethyl triazine, N-hydroxysuccinimide triflate, or the like. These may be used alone or in any combination thereof.

An amount of photons in the exposure process may be amplified by the sensitizer to facilitate a formation of the exposed portion. The sensitizer may include, e.g., benzophenone, benzoyl, thiophene, naphthalene, anthracene, phenanthrene, pyrene, coumarin, thioxantone, acetophenone, naphtoquinone, anthraquinone, or the like. These may be used alone or in any combination thereof.

Figure 5:
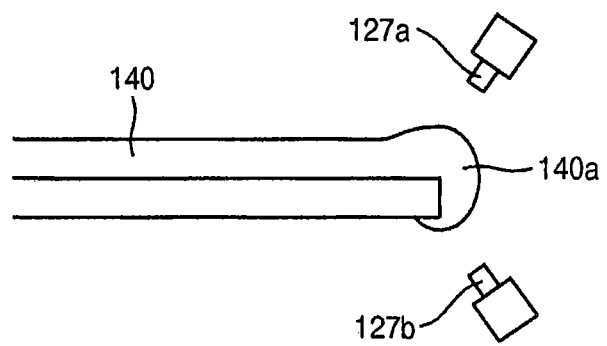

Referring to FIGS. 1 and 5, in operation S40, an edge portion of the substrate 110 may be rinsed or cleaned by a thinner composition. FIG. 5 is enlarged view of a portion indicated by a dashed circle in FIG. 4.

As illustrated in FIG. 5, when the photoresist composition 140 is coated while rotating the spin plate 100, the photoresist composition 140 may be concentrated on an edge portion of the substrate 110 due to a centrifugal force. Accordingly, a protrusion 140a having a relatively large thickness may be formed on the edge portion of the substrate 110. For example, the protrusion 140a may also cover a side of the substrate 110 and a portion of a bottom of the substrate 110.

If the protrusion 140a remains on the substrate 110, a polymer residue may be generated while transferring the substrate 110 after a baking process to result in, e.g., contamination of the spin coating chamber. Further, a defocus may be caused by the protrusion 140a during an exposure process, and productivity and/or accuracy in a manufacture process of a semiconductor device may be deteriorated. Therefore, e.g., an EBR process may be performed using the thinner composition so that the protrusion 140a may be removed from the edge portion of the substrate 110.

In some embodiments, the thinner composition may be injected onto protrusion 140a individually through an upper injector 127a and a lower injector 127b so that the protrusion 140a formed on the top surface and the bottom of the substrate 110 may be effectively removed.

If a volatility of the thinner composition is excessively high, then a stepped portion created by the protrusion 140a may not be overcome. Thus, a sufficient EBR property may not be achieved. If the volatility of the thinner composition is excessively low, then the photoresist composition 140 coated on the substrate 110 may be damaged by the thinner composition to cause an irregular profile such as a PR-tail, and the thinner composition may remain even after the EBR process.

Additionally, if a solubility of the thinner composition with respect to the photoresist material is less than a desired value, then the stepped portion by the protrusion 140a may not be completely removed in the EBR process.

In some embodiments, the same thinner composition 130 used in the above-mentioned pre-wetting process, operation S20, may also be used as the thinner composition in the EBR process. In some embodiments, different thinner compositions of the present inventive concepts are used in the above-mentioned pre-wetting process, operation S20, and EBR process. The thinner composition with components in amounts as described above may have an improved solubility with respect to the photoresist material and an optimized volatility. Thus, the protrusion 140a at the edge portion of the substrate 110 may be completely or substantially removed without causing defects such as a PR-tail.

Figure 6:
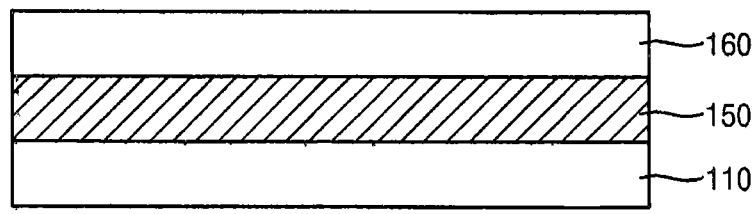

Referring to FIG. 6, an anti-reflective layer 150 and a photoresist layer 160 may be formed on the substrate 110 through, e.g., a soft baking process.

As described above, the BARC composition may be coated on the substrate 110 before injecting the photoresist composition 140.

The BARC composition may include a photo-sensitive organic polymer similar to the photoresist material, and a protrusion may be generated at the edge portion of the substrate 110 by the BARC composition as illustrated in FIG. 5. Thus, a first EBR process for removing the protrusion may be performed using the thinner composition 130.

A first soft baking process may be performed on the coated BARC composition to form the anti-reflective layer 150 on the substrate 110.

The photoresist composition 140 may be coated on the anti-reflective layer 150 as illustrated in FIGS. 2 to 5, and a second EBR process for removing the protrusion 140a may be performed using a thinner composition that may be the same as or different than the thinner composition 130 used in the first EBR process. A second soft baking process may be performed on the coated photoresist composition 140 to form the photoresist layer 160.

Solvents included in the BARC composition and/or the photoresist composition 140 may be removed by the soft baking process so that the BARC composition and/or the photoresist composition 140 may be preliminarily cured. For example, the soft baking process may be performed at a temperature in a range of about 30° C. to about 100° C. The temperature of the soft baking process may be adjusted according to the type of the solvent.

Figure 7:
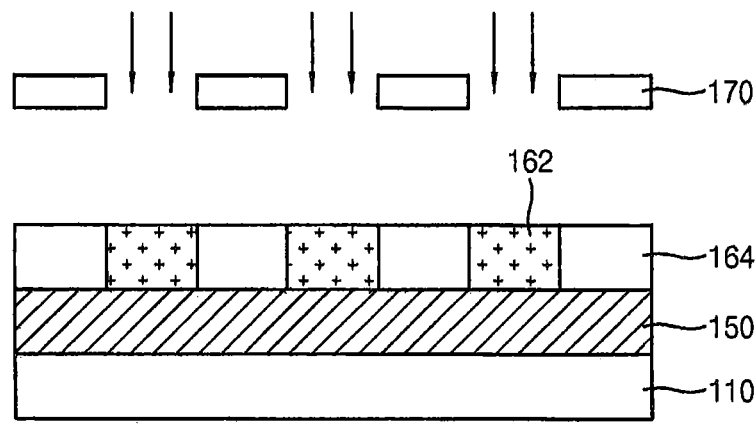
Figure 8:
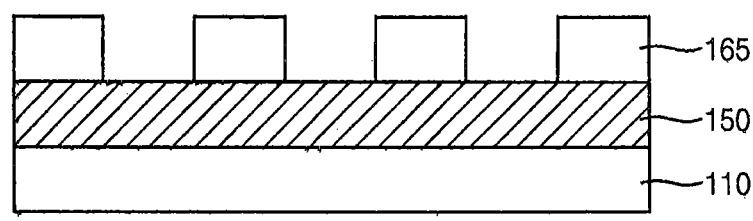

Referring to FIGS. 1, 7 and 8, in an operation S50, the photoresist layer 160 may be transformed into a photoresist pattern 165 by exposure and developing processes.

As illustrated in FIG. 7, an exposure mask 170 including a transmitting portion may be placed over the photoresist layer 160, and a light may be irradiated through the transmitting portion of the exposure mask 170 on the photoresist layer 160. Accordingly, the photoresist layer 160 may be divided into an exposed portion 162 and a non-exposed portion 164.

An acid ($H^+$) may be generated in the exposed portion 162 from the PAG included in the photoresist composition 140. A light source employed in the exposure process may include, e.g., ArF, KrF, an electron beam, I-line, extreme ultraviolet (EUV), or the like.

In some embodiments, a post exposure baking (PEB) process may be further performed after the exposure process. The acid may be uniformly distributed in the exposed portion 162 by the PEB process. Thus, a leaving group such as an acetal group or an ether group combined with the back-bone chain of the photoresist material may be deprotected or separated in the exposed portion 162. Accordingly, the exposed portion 162 may be chemically modified. For example, the exposed portion 162 may be more polar and/or hydrophilic than the non-exposed portion 164.

As illustrated in FIG. 8, the exposed portion 162 may be selectively removed using a developer solution. The photoresist pattern 165 may be defined by the non-exposed portion 164 remaining on the anti-reflective layer 150.

The developer solution may include, e.g., an alcohol-based solution or a hydroxide-based solution such as tetra methyl ammonium hydroxide (TMAH). As described above, the exposed portion 162 may be converted into a pattern that may be remarkably polar and/or hydrophilic relatively to the non-exposed portion 164. Therefore, the exposed portion 162 may be selectively removed by a polar solution such as TMAH.

In some embodiments, a hard baking process may be further performed after the developing process. The photoresist pattern 165 may be further cured by a hard baking process. For example, the hard baking process may be performed at a temperature in a range of about 100° C. to about 200° C.

If the photoresist material includes a negative-type polymer, then the non-exposed portion 164 may be selectively removed by a developing process.

Figure 9:
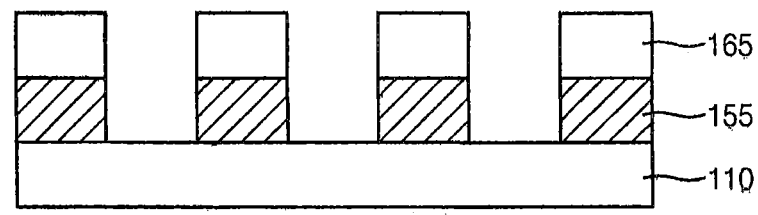

Referring to FIG. 9, the anti-reflective layer 150 may be partially removed using the photoresist pattern 165 as an etching mask. Accordingly, an anti-reflective layer pattern 155 may be formed under the photoresist pattern 165.

FIGS. 10 to 18 are cross-sectional views illustrating a method of manufacturing a semiconductor device in accordance with example embodiments of the present inventive concepts.

Detailed descriptions on processes and/or materials substantially the same as or similar to those illustrated with reference to FIGS. 1 to 9 are omitted herein.

Figure 10:
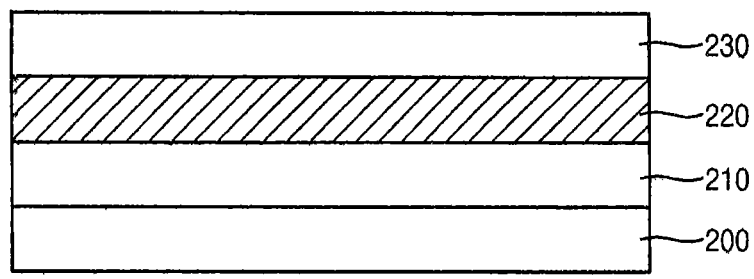
FIGS. 10 to 18 are cross-sectional views illustrating a method of manufacturing a semiconductor device in accordance with example embodiments of the present inventive concepts.

Referring to FIG. 10, a first object layer 210, a first anti-reflective layer 220 and a first photoresist layer 230 may be formed sequentially on a substrate 200.

The substrate 200 may be prepared from a semiconductor wafer including silicon or germanium. The substrate 200 may include a silicon-on-insulator (SOI) substrate or germanium-on-insulator (GOI) substrate.

The first object layer 210 may be a layer for a partial etching process by a photolithography process. In some embodiments, the first object layer 210 may be partially etched by the photolithography process and converted into a pattern including a plurality of holes or openings extending linearly.

The first object layer 210 may include a silicon oxide-based insulating material. For example, the first object layer 210 may include plasma enhanced oxide (PEOX), tetraethyl orthosilicate (TEOS), boro tetraethyl orthoSilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like.

The first object layer 210 may be formed by a chemical vapor deposition (CVD) process, a plasma enhanced chemical vapor deposition (PECVD) process, an atomic layer deposition (ALD) process, or a thermal oxidation process on a top surface of the substrate 200.

The first anti-reflective layer 220 and the first photoresist layer 230 may be formed using the above-mentioned BARC composition and the photoresist composition, respectively.

Before the formation of the first anti-reflective layer 220, a surface of the first object layer 210 may be pre-wetted using the thinner composition in accordance with example embodiments. Accordingly, an amount of the BARC composition required for the formation of the first anti-reflective layer 220 may be reduced so that an RRC property of the photolithography process may be improved.

As described above, the thinner composition may include an acetate-based compound, a lactate-based compound, a propionate-based compound and an ether-based additive.

In some embodiments, PGMEA may be used as the acetate-based compound, an alkyl lactate (e.g., EL) may be used as the lactate-based compound, and HBM may be used as the propionate-based compound. A hydrocarbon-based glycol ether may be used as the ether-based additive. The hydrocarbon-based glycol ether may include dialkylene glycol alkyl ether, dialkylene glycol dialkyl ether, alkylene glycol dialkyl ether and/or alkylene glycol alkyl ether. These may be used alone or in any combination thereof.

In some embodiments, the thinner composition may include PGMEA in an amount in a range of about 30 wt % to about 70 wt %, the alkyl lactate in an amount in a range of about 1 wt % to about 20 wt %, and HBM in an amount in a range of about 30 wt % to about 60 wt %, and may include the hydrocarbon-based glycol ether in an amount in a range of about 10 ppm to about 500 ppm, based on a total amount of the composition.

In some embodiments, the thinner composition may include PGMEA in an amount in a range of about 40 wt % to about 60 wt %, the alkyl lactate in an amount in a range of about 10 wt % to about 20 wt %, and HBM in an amount in a range of about 30 wt % to about 40 wt %, and may include the hydrocarbon-based glycol ether in an amount in a range of about 10 ppm to about 300 ppm, based on a total amount of the composition.

The hydrocarbon-based glycol ether may serve as a surfactant, and may have a viscosity and a molecular weight in the above-mentioned ranges. Accordingly, the thinner composition may have optimized coatability and volatility. After being injected onto the top surface of the first object layer 210 and surface-treating the first object layer 210, the thinner composition may be vaporized so that remaining particles from the composition may be prevented from aggregating.

The BARC composition may be provided on the surface of the first object layer 210 by, e.g., a spin coating process, and a first EBR process may be performed using the thinner composition. Accordingly, a protrusion formed at edge portions of the first object layer 210 and the substrate 200 due to an irregular concentration of the BARC composition may be removed.

The coated BARC composition may be converted into the first anti-reflective layer 220 by a first soft baking process.

The photoresist composition may be provided by a spin coating process on the first anti-reflective layer 220 as described with reference to FIGS. 2 to 5, and a second EBR process may be performed using the thinner composition. The coated photoresist composition may be converted into the first photoresist layer 230 by a second soft baking process.

The EBR processes may be performed using a thinner composition in accordance with example embodiments of the present inventive concepts, so that the first anti-reflective layer 220 and the first photoresist layer 230 may have uniform thicknesses and/or profiles without causing defects such as a PR-tail.

Figure 11:
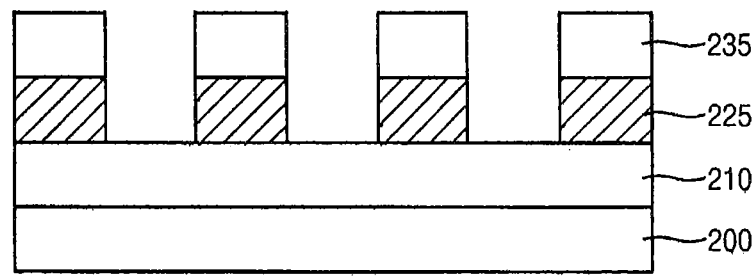

Referring to FIG. 11, processes substantially the same as or similar to those illustrated with reference to FIGS. 7 to 9 are performed.

Accordingly, the first photoresist layer 230 may be partially removed by exposure and developing processes to form a first photoresist pattern 235. The first anti-reflective layer 220 may be partially removed using the first photoresist pattern 235 as a mask to form a first anti-reflective layer pattern 225.

A mask pattern may be defined by the first anti-reflective layer pattern 225 and the first photoresist pattern 235, and the mask pattern may include a plurality of holes through which a top surface of the first object layer 210 may be exposed. Alternatively, an opening extending linearly and exposing the top surface of the first object layer 210 may be defined between the neighboring mask patterns.

Figure 12:
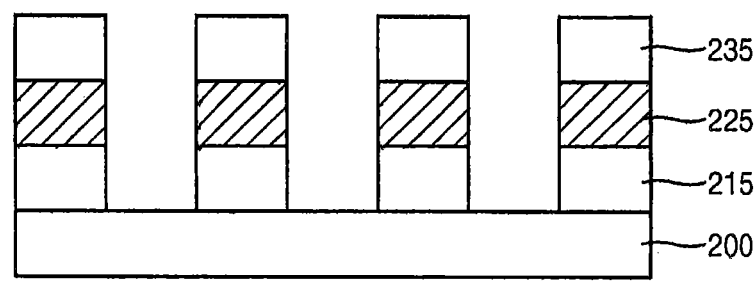

Referring to FIG. 12, the first object layer 210 may be partially etched using the mask pattern. Accordingly, a first object layer pattern 215 including a plurality of contact holes or trenches may be formed.

Figure 13:
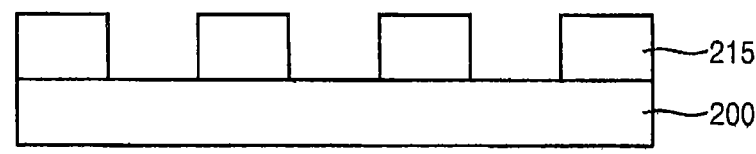

Referring to FIG. 13, the first photoresist pattern 235 and the first anti-reflective layer pattern 225 may be removed by an ashing process and/or a strip process.

Figure 14:
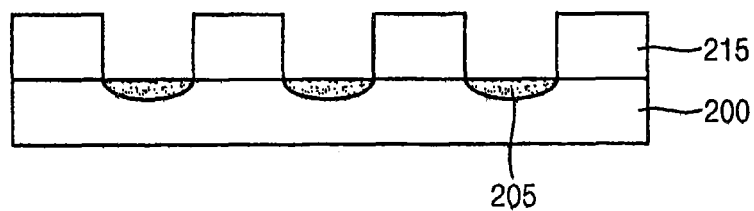

Referring to FIG. 14, n-type or p-type impurities may be implanted at an upper portion of the substrate 200 using the first object layer pattern 215 as an ion-implantation mask. Accordingly, impurity regions 205 may be formed at the upper portion of the substrate 200.

If the first object layer pattern 215 includes the plurality of the contact holes, then impurity region 205 may have an island shape formed at the upper portion of the substrate 200. If the first object layer pattern 215 includes the plurality of the trenches, then the impurity region 205 may extend linearly.

Figure 15:
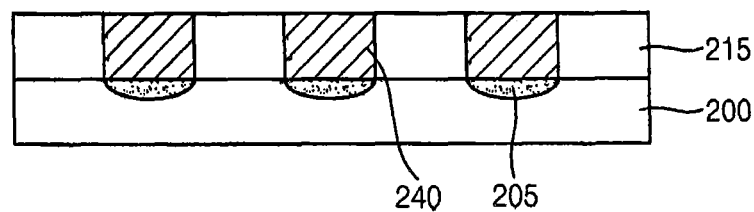

Referring to FIG. 15, a first conductive pattern 240 may be formed in the contact hole or the trench of the first object layer pattern 215.

In some embodiments, a first conductive layer sufficiently filling the contact holes or trenches may be formed on the first object layer pattern 215 using a metal such as copper, tungsten, aluminum, or the like. An upper portion of the first conductive layer may be planarized until a top surface of the first object layer pattern 215 is exposed by, e.g., a chemical mechanical polish (CMP) process such that the first conductive pattern 240 may be formed in each of the contact holes or trenches. The first conductive pattern 240 may have a pillar shape or a line pattern shape.

Figure 16:
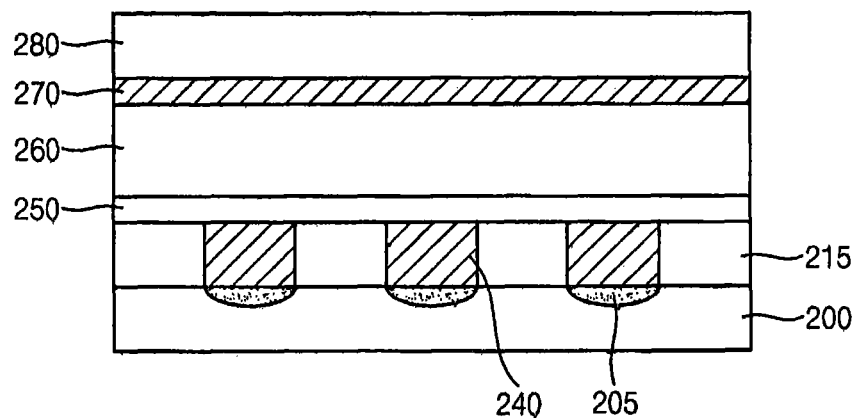

Referring to FIG. 16, an etch-stop layer 250 and a second object layer 260 may be formed on the first object layer pattern 215 and the first conductive pattern 240.

The etch-stop layer 250 may be formed of silicon nitride or silicon oxynitride. The second object layer 260 may include a silicon oxide-based material substantially the same as or similar to that of the first object layer 210.

The etch-stop layer 250 and the second object layer 260 may be formed by, e.g., a CVD process, a PECVD process or an ALD process.

A second anti-reflective layer 270 and a second photoresist layer 280 may be formed on the second object layer 260. The second anti-reflective layer 270 and the second photoresist layer 280 may be formed using the BARC composition and the photoresist composition, respectively.

In some embodiments, before the formation of the second anti-reflective layer 270, a top surface of the second object layer 260 may be pre-wetted by the thinner composition as described above.

A process substantially the same as or similar to the first EBR process may be performed to remove a portion of the BARC composition at an edge portion, and a soft baking process may be performed to form the second anti-reflective layer 270.

The photoresist composition may be coated on the second anti-reflective layer 270. A process substantially the same as or similar to the second EBR process may be performed to remove a portion of the photoresist composition at an edge portion, and a soft baking process may be performed to form the second photoresist layer 280.

Figure 17:
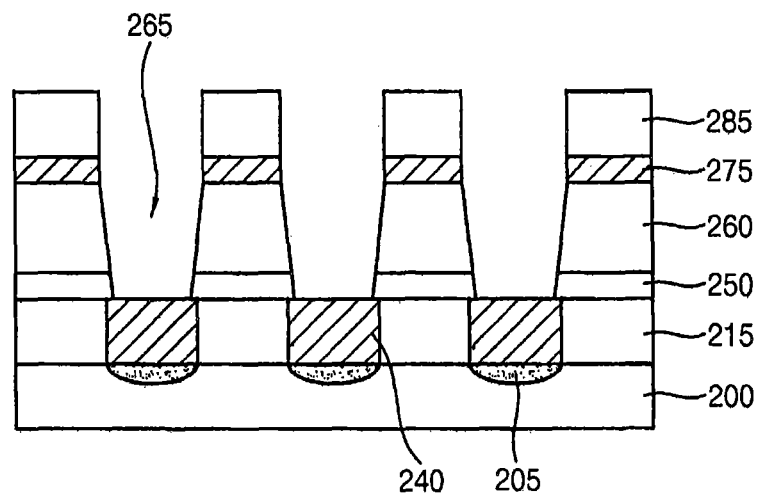

Referring to FIG. 17, processes substantially the same as or similar to those illustrated with reference to FIGS. 7 to 9 may be performed to form a second photoresist pattern 285 and a second anti-reflective layer pattern 275.

The second object layer 260 and the etch-stop layer 250 may be sequentially and partially removed using the second photoresist pattern 285 and the second anti-reflective layer pattern 275 as an etching mask to form an opening 265.

In some embodiments, top surfaces of a plurality of the first conductive patterns 240 may be exposed through the opening 265. In some embodiments, the opening 265 may have a contact hole shape through which each first conductive pattern 240 may be exposed.

After the formation of the opening 265, the second photoresist pattern 285 and the second anti-reflective layer pattern 275 may be removed by an ashing process and/or a strip process.

Figure 18:
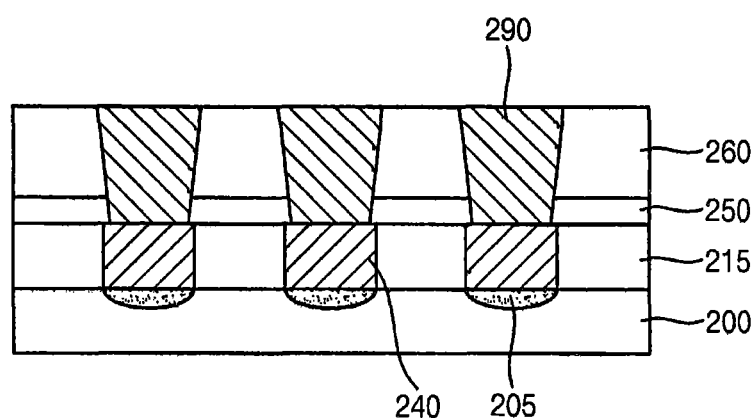

Referring to FIG. 18, a second conductive pattern 290 filling the opening 265 may be formed.

In some embodiments, a second conductive layer filling a plurality of the openings 265 may be formed on the second object layer 260. An upper portion of the second conductive layer may be planarized until a top surface of the second object layer 260 is exposed by, e.g., a CMP process such that the second conductive patterns 290 may be formed in the openings 265. The second conductive layer may be formed of copper, aluminum, tungsten, etc., by a sputtering process or an ALD process.

In some embodiments, before the formation of the second conductive layer, a barrier conductive layer may be formed conformally on an inner wall of the opening 265. The barrier conductive layer may be formed of a metal nitride such as titanium nitride or tantalum nitride.

In some embodiments, the second conductive layer may be formed by a plating process. For example, a seed layer may be formed conformally on the barrier conductive layer by a sputtering process using a copper target. A plating solution containing, e.g., copper sulfate may be used as an electrolyte, and the seed layer and the plating solution may be used as a cathode and an anode, respectively, to apply a current therethrough. Accordingly, the second conductive layer including copper may be precipitated or grown on the seed layer through an electrochemical reaction.

The second conductive pattern 290 may serve as a plug electrically connected to the first conductive pattern 240. The second conductive pattern 290 may serve as an upper wiring electrically connected to a plurality of the first conductive patterns 240.

In some embodiments, a capping layer covering a top surface of the second conductive pattern 290 may be further formed using a metal such as aluminum or molybdenum.

Hereinafter, thinner compositions according to example embodiments of the present inventive concepts may be described in more detail with reference to Experimental Examples.

Preparations of Thinner Compositions

Components were added in a mixing chamber including an agitator at ratios provided in Table 1, below, and stirred at a rate of 500 rpm for an hour to prepare thinner compositions of Examples and Comparative Examples.

TABLE 1

|  | PGMEA (wt %) | EL (wt %) | HBM (wt %) | Additive 1 (ppm) | Additive 2 (ppm) | Additive 3 (ppm) | Additive 4 (ppm) |
|---|---|---|---|---|---|---|---|
| Example 1 | 50 | 10 | 40 | 10 ppm | — | — | — |
| Example 2 | 50 | 20 | 30 | 30 ppm | — | — | — |
| Example 3 | 60 | 10 | 30 | 50 ppm | — | — | — |
| Example 4 | 40 | 20 | 40 | 100 ppm | — | — | — |
| Example 5 | 50 | 10 | 40 | 300 ppm | — | — | — |
| Example 6 | 50 | 10 | 40 | — | 10 ppm | — | — |
| Example 7 | 50 | 10 | 40 | — | 100 ppm | — | — |
| Comparative Example 1 | 50 | 50 | — | 10 ppm | — | — | — |
| Comparative Example 2 | — | 50 | 50 | 10 ppm | — | — | — |
| Comparative Example 3 | 50 | — | 50 | 10 ppm | — | — | — |
| Comparative Example 4 | 50 | 50 | — | — | — | 10 ppm | — |
| Comparative Example 5 | 50 | 50 | — | — | — | 100 ppm | — |
| Comparative Example 6 | 50 | 50 | — | — | — | — | 10 ppm |
| Comparative Example 7 | 50 | 50 | — | — | — | — | 100 ppm |
| Comparative Example 8 | 50 | 50 | — | — | — | — | — |
| Comparative Example 9 | 50 | 10 | 40 | — | — | 10 ppm | — |
| Comparative Example 10 | 50 | 10 | 40 | — | — | — | 10 ppm |
| Comparative Example 11 | 50 | 10 | 40 | 700 ppm | — | — | — |
| Comparative Example 12 | 50 | 10 | 40 | 1000 ppm | — | — | — |

The components used in the preparation of the thinner compositions are described in Table 2 below.

TABLE 2

| Components | Descriptions |
|---|---|
| PGMEA | Propylene Glycol Monomethyl Ether Acetate |
| EL | Ethyl Lactate |
| HBM | methyl 2-hydroxy-2-methyl propionate |
| Additive 1 | Hydrocarbon-based surfactant, dialkylene glycol alkyl ether |
| Additive 2 | Hydrocarbon-based surfactant, dialkylene glycol dialkyl ether |
| Additive 3 | Fluorine (F)-based surfactant, fluorinated acrylic copolymer |

TABLE 2-continued

| Components | Descriptions |
|---|---|
| Additive 4 | Silicon (Si)-based surfactant, polymethyl alkyl silioxane condensate |

EXPERIMENTAL EXAMPLE 1

Removal of Photoresists at Edge-portions

Photoresist (PR) compositions as described in Table 3, below, were spin-coated on an 8-inch oxide silicon substrate to form PR layers. Portions of the PR layers at an edge portion of the substrate were removed using the thinner compositions of the Examples and Comparative Examples provided in Table 1, above, under conditions described in Table 4, below (hereinafter, referred to as an EBR process). The thinner composition was dispensed under a pressure of 1 kgf, and at a flow rate in a range of about 10 cc/min to about 30 cc/min. After the EBR process, EBR properties were estimated using an optical microscope and a scanning electron microscope, and the results are shown in Table 5, below.

TABLE 3

| | PR Type | Resin Type | Layer Thickness (μm) |
|---|---|---|---|
| PR 1 | I-line PR | Novolak | 1.10 |
| PR 2 | KrF PR | Acetal (PHS) | 1.0 |
| PR 3 | ArF PR | Acrylate | 0.18 |
| BARC-1 | KrF BARC | | 0.06 |
| BARC-2 | ArF BARC | | 0.04 |

TABLE 4

| Condition | Spin Rate (rpm) | Time (sec) |
|---|---|---|
| Dispense | 300~2,000 | 7 |
| Spin Coating | variable according to layer thickness | 15 |
| EBR | 2,000 | 20~25 |
| Drying | 1,300 | 6 |

TABLE 5

| | PR 1 | PR 2 | PR 3 | BARC-1 | BARC-2 |
|---|---|---|---|---|---|
| Example 1 | ⊚ | ⊚ | ⊚ | ⊚ | ⊚ |
| Example 2 | ⊚ | ⊚ | ⊚ | ○ | ○ |
| Example 3 | ⊚ | ⊚ | ⊚ | ⊚ | ⊚ |
| Example 4 | ⊚ | ⊚ | ⊚ | ⊚ | ⊚ |
| Example 5 | ⊚ | ⊚ | ⊚ | ⊚ | ⊚ |
| Example 6 | ⊚ | ⊚ | ⊚ | ○ | ○ |
| Example 7 | ⊚ | ⊚ | ⊚ | ○ | ○ |
| Comparative Example 1 | ○ | ○ | Δ | ○ | Δ |
| Comparative Example 2 | Δ | X | X | X | X |
| Comparative Example 3 | ○ | ○ | Δ | Δ | Δ |
| Comparative Example 4 | ○ | ○ | Δ | Δ | Δ |
| Comparative Example 5 | ○ | ○ | Δ | Δ | Δ |
| Comparative Example 6 | Δ | Δ | X | X | X |
| Comparative Example 7 | Δ | X | X | Δ | X |
| Comparative Example 8 | X | X | X | X | X |
| Comparative Example 9 | ○ | ○ | ○ | ○ | Δ |
| Comparative Example 10 | ○ | ○ | ○ | ○ | Δ |
| Comparative Example 11 | ○ | ○ | ○ | ○ | ○ |
| Comparative Example 12 | ○ | ○ | ○ | Δ | ○ |

In the above Table 5, symbols showing the EBR property are provided as follows:
1) ⊚: An edge portion line was formed uniformly after the EBR process.
2) ○: Line uniformity of the edge portion after the EBR process was at least 75%.
3) Δ: An edge portion line was dissolved and/or damaged by the thinner composition after the EBR process.
4) X: A photoresist tailing (PR tail) was generated at the edge portion after the EBR process.

Referring to Table 5, the thinner compositions of Examples 1 to 7 showed an improved EBR property commonly for the PR compositions and the BARC compositions. However, the thinner compositions of Comparative Examples 1 to 12 caused damage of the edge portion and a PR tail in many cases.

EXPERIMENTAL EXAMPLE 2

Estimation on Defects Varying Photoresist Types

Improvements in defects for the PR compositions provided in Table 3, above, were evaluated using the thinner compositions of the above-described Examples 1 to 7, and Comparative Examples 1 to 12. The PR compositions of the five types were coated on an 8-inch oxide silicon substrate according to process conditions listed in Table 6, below, and then soft baking, exposure and developing processes were performed. Surface defects on the substrate after the developing process were measured with a defect measuring device (KLA-2810, manufactured by KLA Co., Ltd.). The results are shown in Table 7 below.

TABLE 6

| Step | Time (sec) | Spin Rate (rpm) | Angular Velocity (rpm/sec) | Dispense (cc) |
|---|---|---|---|---|
| 1 | 2 | 0 | 10,000 | 0 |
| 2 | 2 | 1,000 | 10,000 | 0 |
| 3 | 4 | 1,000 | 10,000 | 2.0 (Thinner) |
| 4 | 2 | 1,000 | 10,000 | — |
| 5 | 4 | 1,500 | 10,000 | 2.0 (PR) |
| 6 | 9.5 | 2,500 | 10,000 | 0 |
| 7 | 0 | 0 | 10,000 | 0 |

TABLE 7

| | PR 1 | PR 2 | PR 3 | BARC-1 | BARC-2 |
|---|---|---|---|---|---|
| Example 1 | ⊚ | ⊚ | ⊚ | ⊚ | ⊚ |
| Example 2 | ⊚ | ⊚ | ⊚ | ○ | ○ |
| Example 3 | ⊚ | ⊚ | ⊚ | ⊚ | ⊚ |
| Example 4 | ⊚ | ⊚ | ⊚ | ⊚ | ⊚ |
| Example 5 | ⊚ | ⊚ | ⊚ | ⊚ | ⊚ |
| Example 6 | ⊚ | ⊚ | ⊚ | ○ | ○ |

TABLE 7-continued

|  | PR 1 | PR 2 | PR 3 | BARC-1 | BARC-2 |
|---|---|---|---|---|---|
| Example 7 | ⊚ | ⊚ | ⊚ | ○ | ○ |
| Comparative Example 1 | ⊚ | ○ | ○ | ○ | ○ |
| Comparative Example 2 | ⊚ | ○ | ○ | ○ | ○ |
| Comparative Example 3 | ○ | ○ | ○ | ○ | ○ |
| Comparative Example 4 | ○ | ○ | X | △ | △ |
| Comparative Example 5 | ○ | △ | X | △ | △ |
| Comparative Example 6 | ○ | △ | X | ○ | △ |
| Comparative Example 7 | ○ | △ | X | ○ | △ |
| Comparative Example 8 | ○ | ○ | ○ | ○ | ○ |
| Comparative Example 9 | ○ | ○ | X | ○ | △ |
| Comparative Example 10 | ○ | ○ | △ | △ | ○ |
| Comparative Example 11 | ○ | ○ | △ | ○ | ○ |
| Comparative Example 12 | ○ | ○ | △ | ○ | ○ |

In the above Table 7, symbols categorize the defects as follows:

1) ⊚: The number of defects was less than 100 after the exposure/developing processes.

2) ○: The number of defects was between 100 and 200 after the exposure/developing processes.

3) △: The number of defects was between 200 and 500 after the exposure/developing processes.

4) X: The number of defects was more than 2,000 after the exposure/developing processes.

EXPERIMENTAL EXAMPLE 3

Estimation on Rework Property Varying Photoresist Types

Rework properties of the PR compositions provided in Table 3, above, were evaluated using thinner compositions of the above-described Examples 1 to 7, and Comparative Examples 1 to 12. The PR compositions of the five types were coated on an 8-inch oxide silicon substrate according to process conditions listed in Table 8, below, and a rework process was performed with respect to each substrate after a soft baking process using the thinner compositions. In cases of BARC-1 and BARC-2, the rework process was performed without the soft baking process. A surface of each substrate was detected after the rework process with a surface scanning device of TOPCON Co., Ltd. (WM-1500) to estimate the rework property. The results are shown in Table 9 below.

TABLE 8

| Step | Time (sec) | Spin Rate (rpm) | Angular Velocity (rpm/sec) | Dispense (cc) |
|---|---|---|---|---|
| 1 | 2 | 0 | 10,000 | 0 |
| 2 | 2 | 1,000 | 10,000 | 0 |
| 3 | 4 | 1,000 | 10,000 | 2.0 (Thinner) |
| 4 | 9.5 | 2,500 | 10,000 | 0 |
| 5 | 0 | 0 | 10,000 | 0 |

TABLE 9

|  | PR 1 | PR 2 | PR 3 | BARC-1 | BARC-2 |
|---|---|---|---|---|---|
| Example 1 | ⊚ | ⊚ | ○ | ⊚ | ⊚ |
| Example 2 | ⊚ | ⊚ | ⊚ | ○ | ⊚ |
| Example 3 | ⊚ | ⊚ | ○ | ⊚ | ○ |
| Example 4 | ⊚ | ⊚ | ⊚ | ⊚ | ⊚ |
| Example 5 | ⊚ | ⊚ | ⊚ | ⊚ | ⊚ |
| Example 6 | ⊚ | ⊚ | ⊚ | ⊚ | ○ |
| Example 7 | ⊚ | ⊚ | ⊚ | ○ | ○ |
| Comparative Example 1 | ○ | △ | ○ | ○ | △ |
| Comparative Example 2 | ○ | ○ | △ | ○ | △ |
| Comparative Example 3 | ⊚ | ○ | △ | △ | △ |
| Comparative Example 4 | ○ | △ | △ | ○ | △ |
| Comparative Example 5 | ○ | △ | △ | ○ | △ |
| Comparative Example 6 | ○ | △ | △ | ○ | △ |
| Comparative Example 7 | ○ | △ | △ | ○ | △ |
| Comparative Example 8 | ○ | △ | △ | ○ | △ |
| Comparative Example 9 | ○ | ○ | △ | △ | △ |
| Comparative Example 10 | ○ | ○ | ○ | △ | △ |
| Comparative Example 11 | ○ | ○ | △ | ○ | ○ |
| Comparative Example 12 | ○ | ○ | △ | ○ | △ |

In the above Table 9, symbols categorize the rework properties as follows:

1) ⊚: The number of surface particles was less than 1,000.

2) ○: The number of surface particles was between 1,000 and 2,000.

3) △: The number of surface particles was between 2,000 and 3,000.

4) X: The number of surface particles was more than 3,000.

EXPERIMENTAL EXAMPLE 4

Estimation on RRC Property Varying Photoresist Types

RRC properties of the PR compositions provided in Table 3, above, were evaluated using the thinner compositions of the above-described Examples 1 to 7 and Comparative Examples 1 to 12. The PR compositions of the five types were coated on an 8-inch oxide silicon substrate according to the process conditions listed in Table 10, below, and an RRC process was performed with respect to each substrate after a soft baking process using the thinner compositions. In cases of BARC-1 and BARC-2, the RRC process was performed without the soft baking process. The RRC properties were evaluated by dispensing a predetermined amount of the thinner composition, re-coating the PR composition again, and measuring a consumption, of the PR composition. Specifically, the consumptions of the PR compositions were measured by re-coating 1.2 cc of PR1, 1.0 cc of PR2, 0.8 cc of PR3, 0.5 cc of BARC-1 and 0.4 cc of BARC-2. The results are shown in Table below 11.

TABLE 10

| Step | Time (sec) | Spin Rate (rpm) | Angular Velocity (rpm/sec) | Dispense (cc) |
|---|---|---|---|---|
| 1 | 2.5 | 0 | 10,000 | 0.5 (Thinner) |
| 2 | 1.5 | 900 | 10,000 | 0 |
| 3 | 9.5 | 2,000 | 10,000 | 0 |
| 4 | 3.0 | 600 | 10,000 | 0.5-1 (PR) |
| 5 | 5.0 | 1,500 | 10,000 | 0 |
| 6 | 10.0 | 1,000 | 10,000 | 0 |

TABLE 11

|  | PR 1 | PR 2 | PR 3 | BARC-1 | BARC-2 |
|---|---|---|---|---|---|
| Example 1 | ⊚ | ⊚ | ⊚ | ⊚ | ⊚ |
| Example 2 | ⊚ | ⊚ | ⊚ | ⊚ | ⊚ |
| Example 3 | ⊚ | ⊚ | ○ | ⊚ | ⊚ |
| Example 4 | ⊚ | ⊚ | ○ | ⊚ | ⊚ |
| Example 5 | ⊚ | ⊚ | ⊚ | ⊚ | ⊚ |
| Example 6 | ⊚ | ⊚ | ○ | ⊚ | ⊚ |
| Example 7 | ⊚ | ⊚ | ⊚ | ⊚ | ⊚ |
| Comparative Example 1 | ○ | ○ | ○ | ○ | ○ |
| Comparative Example 2 | △ | △ | △ | △ | △ |
| Comparative Example 3 | ⊚ | ○ | ○ | ○ | ○ |
| Comparative Example 4 | ⊚ | ⊚ | ○ | ○ | ○ |
| Comparative Example 5 | ⊚ | ⊚ | ○ | ○ | ○ |
| Comparative Example 6 | ⊚ | ⊚ | ○ | ○ | ○ |
| Comparative Example 7 | ⊚ | ⊚ | ○ | ○ | ○ |
| Comparative Example 8 | ⊚ | ⊚ | ○ | ○ | ○ |
| Comparative Example 9 | ⊚ | ⊚ | ○ | ⊚ | ○ |
| Comparative Example 10 | ⊚ | ⊚ | ○ | ⊚ | ○ |
| Comparative Example 11 | ⊚ | ⊚ | ○ | ⊚ | ○ |
| Comparative Example 12 | ⊚ | ⊚ | ○ | ⊚ | ○ |

In the above Table 9, symbols categorize the RRC properties as follows:

1) ⊚: A ratio of the PR composition re-coated on the substrate was more than 99%.

2) ○: A ratio of the PR composition re-coated on the substrate was between 97% and 98%.

3) △: A ratio of the PR composition re-coated on the substrate was between 95% and 97%.

4) X: A ratio of the PR composition re-coated on the substrate was less than 95%.

According to example embodiments of the present inventive concepts, a thinner composition may be used for pre-wetting a substrate without causing pollution and/or particles. Additionally, an irregular photoresist portion formed at an edge of the substrate may be rapidly removed using the thinner composition without pattern failure. Thus, RRC and EBR properties in a semiconductor manufacture may be improved. The thinner composition may also be utilized in a photolithography process for manufacturing a display device, e.g., an OLED device or an LCD device.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present inventive concepts as well as the appended claims.

What is claimed is:

1. A thinner composition comprising:
    an acetate-based compound in an amount in a range of about 30 weight percent to about 70 weight percent;
    a lactate-based compound in an amount in a range of about 1 weight percent to about 20 weight percent;
    a propionate-based compound in an amount in a range of about 30 weight percent to about 60 weight percent; and
    an ether-based surfactant in an amount in a range of about 10 parts per million (ppm) to about 500 ppm, based on a total amount of the composition,
    wherein the ether-based surfactant includes at least one of diethylene glycol methyl ethyl ether, ethylene glycol methyl ether, diethylene glycol methyl ether, diethylene glycol ethyl ether, diethylene glycol butyl ether, diethylene glycol dimethyl ether, and diethylene glycol diethyl ether.

2. The thinner composition of claim 1, wherein the acetate-based compound is in an amount in a range of about 40 weight percent to about 60 weight percent;
    the lactate-based compound is in an amount in a range of about 10 weight percent to about 20 weight percent;
    the propionate-based compound is in an amount in a range of about 30 weight percent to about 40 weight percent; and
    the ether-based surfactant is in an amount in a range of about 10 ppm to about 300 ppm, based on the total amount of the composition.

3. The thinner composition of claim 1, wherein the acetate-based compound includes propylene glycol alkyl ether acetate, the lactate-based compound includes an alkyl lactate, and the propionate-based compound includes methyl 2-hydroxy-2-methyl propionate (HBM).

* * * * *